United States Patent [19]

Taka et al.

[11] Patent Number: 5,399,511
[45] Date of Patent: Mar. 21, 1995

[54] METHOD OF MANUFACTURING A HETERO BIPOLAR TRANSISTOR

[75] Inventors: Shin-ichi Taka, Yokosuka; Kouji Kimura; Hiroshi Naruse, both of Kawasaki; Kuniaki Kumamaru, Yokohama, all of Japan

[73] Assignee: Kabushiki Kaisha Toshiba, Kawasaki, Japan

[21] Appl. No.: 280,199

[22] Filed: Jul. 25, 1994

Related U.S. Application Data

[62] Division of Ser. No. 45,707, Apr. 14, 1993, Pat. No. 5,365,090.

[30] Foreign Application Priority Data

Apr. 15, 1992 [JP] Japan ................................. 4-121283

[51] Int. Cl.$^6$ ......................................... H01L 21/265
[52] U.S. Cl. ......................................... 437/31; 437/89; 437/106; 437/131
[58] Field of Search ............... 437/31, 32, 89, 106, 437/110, 126, 131, 132, 909; 148/DIG. 59

[56] References Cited

U.S. PATENT DOCUMENTS

| | | | |
|---|---|---|---|
| 3,242,018 | 3/1966 | Grabmaier et al. | 148/180 |
| 4,935,797 | 6/1990 | Jambotkar | 357/34 |
| 4,963,957 | 10/1990 | Ohi et al. | 257/518 |
| 4,969,026 | 11/1990 | Vander Velden et al. | 257/518 |
| 5,006,912 | 4/1991 | Smith et al. | 357/34 |
| 5,140,400 | 8/1992 | Morishita | 357/34 |
| 5,198,689 | 3/1993 | Fujioka | 257/197 |

FOREIGN PATENT DOCUMENTS

| | | |
|---|---|---|
| 0130774 | 1/1985 | European Pat. Off. . |
| 0177246 | 4/1986 | European Pat. Off. . |
| 0188897 | 7/1986 | European Pat. Off. . |
| 0194197 | 9/1986 | European Pat. Off. . |
| 0430279 | 6/1991 | European Pat. Off. . |
| 0550962 | 7/1993 | European Pat. Off. . |
| 63-291468 | 11/1988 | Japan . |

OTHER PUBLICATIONS

Theodore I. Kamins et al., "Small–Geometry, High-performance, Si–Si$_{1-x}$Ge$_x$ Heterojunction Bipolar Transistors," IEEE Electron Device Letters, No. 11, Nov. 1989 (New York) European Search Report.

John D. Cressler et al., "Sub–30-ps ECL Circuit Operation at Liquid–Nitrogen Temperature Using Self-Aligned Epitaxial SiGe–Base Bipolar Transistors," IEEE Electron Device Letters, vol. 12, No. 4, pp. 166–168, (Apr. 1991).

Primary Examiner—Brian E. Hearn
Assistant Examiner—Tuan Nguyen
Attorney, Agent, or Firm—Finnegan, Henderson Farabow, Garrett & Dunner

[57] ABSTRACT

The specification discloses a hetero bipolar transistor which comprises a semiconductor substrate, a first silicon layer serving as a collector, a first silicon-germanium layer serving as a base, a second silicon layer serving as a collector, and a second silicon-germanium layer. A side wall of the second silicon-germanium layer is in contact with side walls of the first silicon layer, the first silicon-germanium layer and the second silicon layer. The second silicon-germanium layer is disposed to surround the first silicon layer, the first silicon-germanium layer, and the second silicon layer, and has an energy band gap substantially the same as that of the first silicon-germanium layer.

6 Claims, 7 Drawing Sheets

METHOD OF MANUFACTURING A HETERO BIPOLAR TRANSISTOR

This is a division of application Ser. No. 08/045,707, filed Apr. 14, 1993, now U.S. Pat. No. 5,365,090.

BACKGROUND OF THE INVENTION

1. Field of the Invention

The present invention relates to a hetero bipolar transistor and a method of manufacturing the same, particularly, to a hetero bipolar transistor which can be operated with a higher speed and a method of manufacturing the same.

2. Description of the Related Art

Miniaturization and improvement in the operating speed of a silicon bipolar transistor have now been achieved to some extent. Also, vigorous researches are being made nowadays on a silicon-based hetero bipolar transistor in an attempt to further improve the amplification factor and decrease the base resistance of the bipolar transistor.

Figure 1:
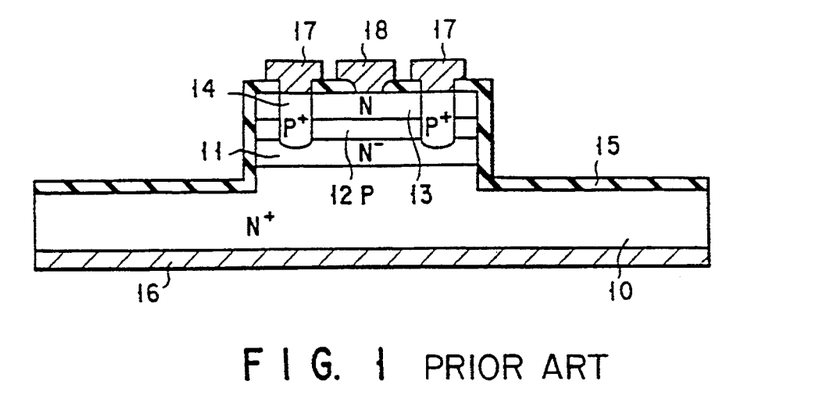
FIG. 1 is a cross sectional view showing a first conventional hetero bipolar transistor.

FIG. 1 shows a first example of a conventional hetero bipolar transistor of so-called "mesa-type", which is a typical conventional silicon-based hetero bipolar transistor. As seen from the drawing, an N⁻-type silicon layer (collector region) 11, a P-type Si-Ge layer (base region) 12, and an N-type silicon layer (emitter region) 13 are successively formed by an epitaxial growth method on an N⁺-type silicon substrate 10, followed by forming a P⁺-type base contact region 14 by means of an ion implantation. Then, the laminate structure consisting of these epitaxial layers is selectively removed by etching to form a mesa structure including the P⁺-type base contact region 14, followed by forming an insulating film 15 covering the entire surface including the side wall of the mesa structure. After formation of the insulating film 15, emitter and base openings are formed, followed by forming an emitter electrode 18 and a base electrode 17. Further, a collector electrode 16 is formed on the back surface of the substrate.

The conventional hetero bipolar transistor in FIG. 1 has a rough surface and, thus, is unsuitable for forming an integrated circuit. It should also be noted that the P⁺-type base contact region 14 is formed after formation of the epitaxial layers in the first prior art shown in FIG. 1. What should be noted is that the heat resistance of the Si-Ge layer 12 included in the epitaxial layers is relatively low. Specifically, the Si-Ge layer 12 is capable of resisting heat of only about 850° C., with the result that a sufficient heat treatment cannot be applied to the P⁺-type base contact region 14 after the ion implantation step. It follows that the base resistance cannot be lowered sufficiently. What should also be noted is that pn junctions are formed between the P⁺-type base contact region 14 and the emitter region 13 and between the region 14 and the collector region 11, leading to an increased emitter-base capacitance and an increased base-collector capacitance.

Figure 2:
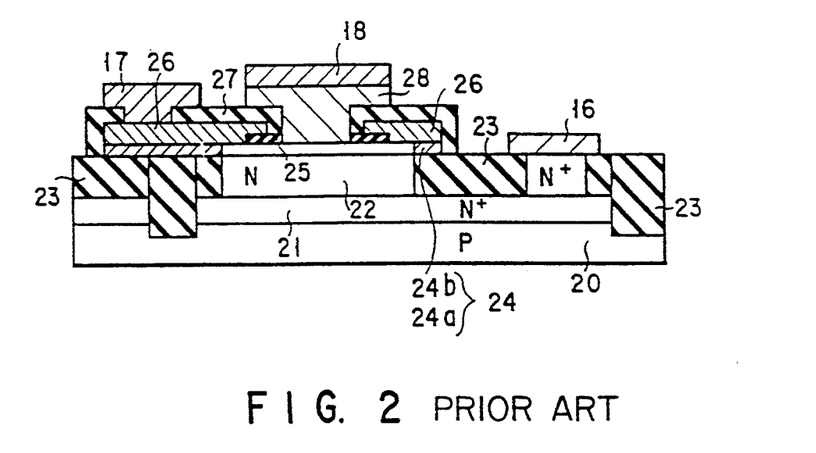
FIG. 2 is a cross sectional view showing a second conventional hetero bipolar transistor.

FIG. 2 shows a second example of a conventional hetero bipolar transistor, which is a typical example of a conventional bipolar transistor of a non-self-alignment type. The second prior art shown in FIG. 2 is of a planar type. As shown in the drawing, an N⁺-type silicon buried layer 21 and an N-type silicon layer (collector region) 22 are formed in this order on a P-type silicon substrate 20, followed by forming an element separation region 23 consisting of an insulating material so as to define an element-forming region. In the next step, a P-type Si-Ge layer 24 is formed in a manner to cover a transistor-forming region. That portion of the Si-Ge layer which is in contact with a silicon single crystal forms a single crystalline Si-Ge layer 24a. On the other hand, that portion of the Si-Ge layer which is in contact with the element separating region 23 forms a polycrystalline Si-Ge layer 24b.

Further, an etching-stopping layer (SiN layer) 25 is formed in a manner to cover an emitter-forming region on the surface of the single crystalline Si-Ge layer (base region) 24a. After formation of the etching-stopping layer 25, a P⁺-type polycrystalline silicon layer 26 acting as a lead wire connected to the base region is formed in a manner to cover the etching-stopping layer 25 and the Si-Ge layer 24. Then, that portion of the P⁺-type polycrystalline silicon layer 26 which is positioned in the emitter-forming region is removed, followed by forming an insulating layer 27 in a manner to cover the P⁺-type polycrystalline silicon layer 26. Further, the etching-stopping layer 25 positioned within the emitter-forming region is removed, followed by forming an emitter polycrystalline silicon layer 28. Finally, a collector electrode 16, a base electrode 17, and an emitter electrode 18 are formed as shown in the drawing.

The second prior art shown in FIG. 2 is of a planar type, making it possible to use the second prior art for forming an integrated circuit. In this prior art, however, the P⁺-type polycrystalline silicon layer leading to the base region is not self-aligned with the base layer, with the result that the base resistance is increased. Further, openings are formed in the etching-stopping layer 25 before formation of the emitter polycrystalline silicon layer 28. What should be noted is that the surface of the single crystalline Si-Ge layer is exposed to the outer atmosphere when the openings are formed in the etching-stopping layer, with the result that a natural oxide film is formed on the exposed surface. It follows that it is difficult to control the interface between the emitter polycrystalline silicon layer 28 and the base Si-Ge layer 24a.

Figure 3:
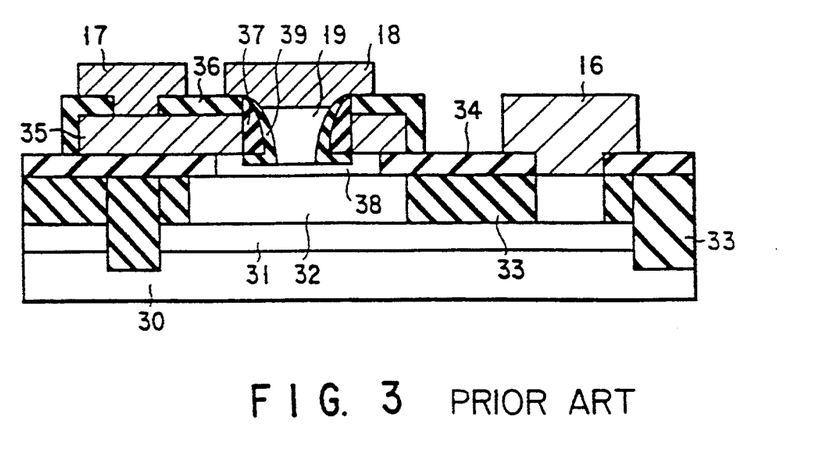
FIG. 3 is a cross sectional view showing a third conventional hetero bipolar transistor.

FIG. 3 shows a third example of a conventional hetero bipolar transistor, which is of a typical self-alignment type. As shown in the drawing, an N⁺-type silicon buried layer 31 and an N-type silicon layer (collector region) 32 are formed in this order on a P-type silicon substrate 30, followed by forming an element separating region 33 consisting of an insulating material so as to define an element-forming region. Then, a second insulating film 34 is deposited on the substrate surface, followed by forming a P⁺-type polycrystalline silicon layer 35 acting as a wiring leading to a base region and subsequently forming an insulating film 36 in a manner to cover the upper and side surfaces of the polycrystalline silicon layer 35. Further, the insulating film 36 and the P⁺-type polycrystalline silicon layer 35 on an emitter-forming region are selectively removed to selectively expose the second insulating film 34, followed by forming a first side wall 37 consisting of an insulating film. In the next step, the exposed portion of the second insulating film 34 is removed by etching to form an opening. In this step, the opening extends sideward because of the side etching of the second insulating film 34. After the etching step, a P-type Si-Ge epitaxial layer (base region) 38 is formed within the opening thus formed. Then, the opening above the base region 38 is filled with an insulating film, followed by selectively etching the insulating film. In this step, a second side wall 39 is formed because of the side etching effect. Further, an emitter polycrystalline silicon layer 19 is formed in the opening resulting from the selective etching of the insulating film. Still further, the insulating films covering the collector region, base region and emitter region are selectively removed to form openings, followed by forming a collector electrode 16, a base electrode 17 and an emitter electrode 18 in the openings thus formed.

In the third prior art shown in FIG. 3, the insulating film filling the opening positioned above the base Si-Ge layer 38 is removed by an reactive ion etching (RIE) to form the second side wall 39. What should be noted is that the thin base Si-Ge layer 38 is struck by ions during the reactive ion etching step. As a result, problems take place such as reduction in the thickness, contamination and disturbance of crystals of the base Se-Ge layer 38, leading to difficulties in the control capability and element characteristics of the device. Also, the Si-Ge base layer 38 is exposed to the outside before formation of the emitter polycrystalline silicon layer 19, as in the second prior art shown in FIG. 2. As a result, a natural oxide film is formed, making it difficult to control the interface between the emitter polycrystalline silicon layer 35 and the base Si-Ge layer 38.

As described above, the conventional hetero bipolar transistors leave much room further improvements. To reiterate, the first prior art shown in FIG. 1, i.e., a hetero bipolar transistor of mesa type, is not suitable for forming an integrated circuit. Also, the first prior art has a high base resistance and a high parasitic capacitance between the emitter and base regions and between the base and collector regions. When it comes to the second prior art shown in FIG. 2, i.e., a hetero bipolar transistor of a planar non-self-alignment type, it is certainly possible to use the bipolar transistor forming an integrated circuit. However, the second prior art has a high base resistance because the transistor is of a non-self-alignment type. Also, since the surface of the base Si-Ge layer is exposed to the outside before the step of forming the emitter layer, the exposed surface of the base layer tends to be contaminated, making it difficult to control as desired the interface between the base and emitter regions.

The third prior art shown in FIG. 3, i.e., a hetero bipolar transistor of a planar and self-alignment type, certainly permits improving the problems inherent in the first and second prior arts to some extent. In the third prior art, however, it is necessary to form the second side wall because the transistor is of a self-alignment type. What should be noted is that the second side wall is formed by selectively removing an insulating film formed in advance. The insulating film is selectively removed by a reactive ion etching. During the reactive ion etching step, a thin base Si-Ge layer is struck by ions. As a result, mechanical damages are done to the base Si-Ge layer such as reduction in the thickness, contamination and crystal disturbance, leading to difficulties in the control capability and element characteristics. Further, the surface of the base Si-Ge layer is exposed to the air atmosphere during the manufacturing process of the hetero bipolar transistor, as in the second prior art shown in FIG. 2. It follows that the surface of the base Si-Ge layer tends to be contaminated. Also, it is difficult to control the interface between the emitter and base regions.

SUMMARY OF THE INVENTION

The present invention has been achieved in view of the situation described above and is intended to provide an improved hetero bipolar transistor and a method of manufacturing the same. To be more specific, the present invention is intended to suppress undesired mechanical damages done to the base layer such as reduction in the thickness and disturbance of crystals, and to prevent the outer surface of a base Si-Ge layer from being exposed to the air atmosphere during the manufacturing process of the hetero bipolar transistor so as to improve the capability of controlling the emitter-base interface. The present invention is also intended to achieve a base-emitter structure by self-alignment technique without employing a manufacturing step requiring a technique of a particularly high level so as to diminish sufficiently the base resistance and the stray capacitance. It follows that the hetero bipolar transistor of the present invention can be operated with a high speed.

According to the present invention, there is provided a hetero bipolar transistor, comprising:

a semiconductor substrate;

a first semiconductor layer of a first conductivity type formed on said semiconductor substrate;

a second semiconductor layer of a second conductivity type formed on said first semiconductor layer;

a third semiconductor layer of the first conductivity type formed on said second semiconductor layer, said third semiconductor layer having an energy bang gap larger than that of said second semiconductor layer; and a fourth semiconductor layer of the second conductivity type disposed to surround said first, second and third semiconductor layers, a side wall of said fourth semiconductor layer being in contact with side walls of said first, second and third semiconductor layers, and an energy bang gap of said fourth semiconductor layer being substantially the same as that of said second semiconductor layer.

The present invention also provides a method of manufacturing a hetero bipolar transistor, comprising the steps of:

preparing a semiconductor substrate;

forming a first polycrystalline silicon layer on an entire surface of said semiconductor substrate;

selectively removing said first polycrystalline silicon layer to expose a surface of said semiconductor substrate;

forming an oxynitride layer on an entire surface of the resultant structure in a manner to cover a side wall of said first polycrystalline silicon layer;

forming a first insulating layer on the resultant structure;

selectively removing said first insulating layer, said oxynitride layer and said first polycrystalline silicon layer to form an opening extending to reach said semiconductor substrate, said side wall of said first polycrystalline silicon layer not being exposed by said opening;

forming a laminate structure consisting of a first semiconductor layer, a second semiconductor layer and a third semiconductor layer by means of an epitaxial growth technique, said opening being filled with said laminate structure, and at least a side wall of said second semiconductor layer being in contact with the side wall of said oxynitride layer;

selectively removing said insulating layer and said oxynitride layer to allow the remaining portions of these insulating layer and oxynitride layer to surround said laminate structure consisting of the first, second and third semiconductor layers;

removing the remaining portion of said oxynitride layer to form a cavity; and forming a fourth semiconductor layer by means of an epitaxial growth technique to cover the first polycrystalline silicon layer and the laminate structure consisting of the first, second and third semiconductor layers, said cavity being filled with said fourth semiconductor layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 6 to 16 are cross sectional views collectively showing a method of manufacturing the hetero bipolar transistor according to the embodiment of the present invention, wherein

DETAILED DESCRIPTION OF THE PREFERRED EMBODIMENT

Let us describe a hetero bipolar transistor according to one embodiment of the present invention with reference to the accompanying drawings.

Figure 4:
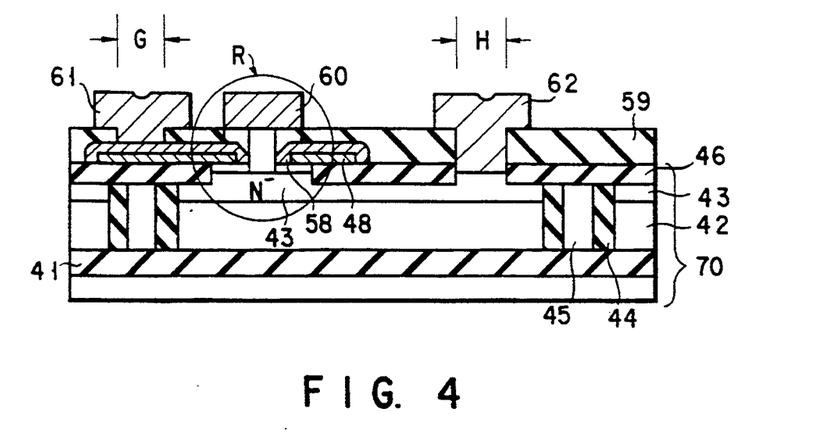
FIG. 4 is a cross sectional view showing a hetero bipolar transistor according to an embodiment of the present invention.
Figure 5:
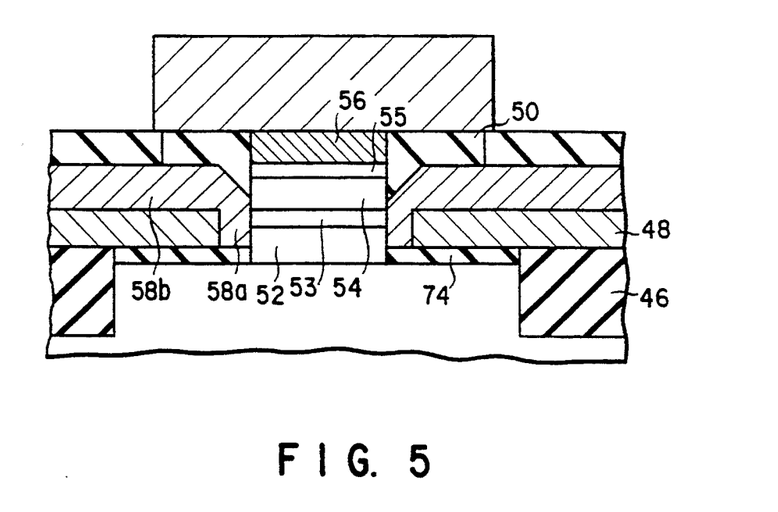
FIG. 5 is a cross sectional view showing in a magnified fashion a gist portion of the hetero bipolar transistor according to the embodiment of the present invention.

FIG. 4 is a cross sectional view showing a hetero bipolar transistor according to one embodiment of the present invention. On the other hand, FIG. 5 shows in a magnified fashion a gist portion of the hetero bipolar transistor put in a circle R in FIG. 4.

In the hetero bipolar transistor according to the embodiment shown in FIG. 4, a laminate structure consisting of first, second and third single crystal semiconductor layers is formed on a main surface of an N⁻-type silicon layer 43 constituting the uppermost layer of a SOI (silicon on insulator) substrate 70. As shown in the drawings, the laminate structure noted above consists of a first single crystal semiconductor layer (N-type silicon layer) 52 of a first conductivity type, which is formed of a first semiconductor material, a second single crystal semiconductor layer (P-type Si-Ge layer) 53 of a second conductivity type opposite to said first conductivity type, which is formed of a second semiconductor material, and a third single crystal semiconductor layer (N-type silicon layer) 54 of the first conductivity type, which is formed of the first semiconductor material. The hetero bipolar transistor also comprises a fourth single crystal semiconductor layer (P-type single crystal Si-Ge layer) 58a which is in contact with the side wall of each of the first single crystal semiconductor layer (N-type silicon layer) 52, the second single crystal semiconductor layer (P-type Si-Ge layer) 53 and the third single crystal semiconductor layer (N-type silicon layer) 54.

Figure 6:
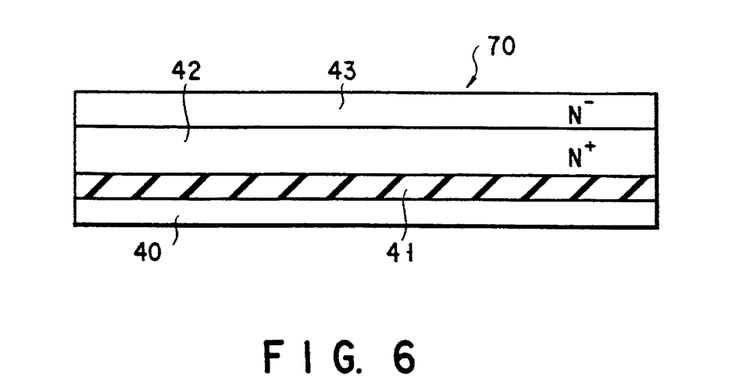

FIGS. 6 to 16 collectively show how to manufacture the hetero bipolar transistor shown in FIG. 4. First of all, FIG. 6 shows a SOI substrate 70 included in the hetero bipolar transistor of the present invention. As seen from the drawing, the SOI substrate 70 is prepared by forming successively a silicon oxide film 41, an N⁺-type silicon layer 42, and an N⁻-type silicon layer 43 on a silicon substrate 40. It is possible to use an ordinary epitaxial substrate or a silicon substrate as the substrate 70. However, it is desirable to use a SOI substrate as shown in the drawing so as to diminish, for example, a stray capacitance in the produced bipolar transistor.

Figure 7:
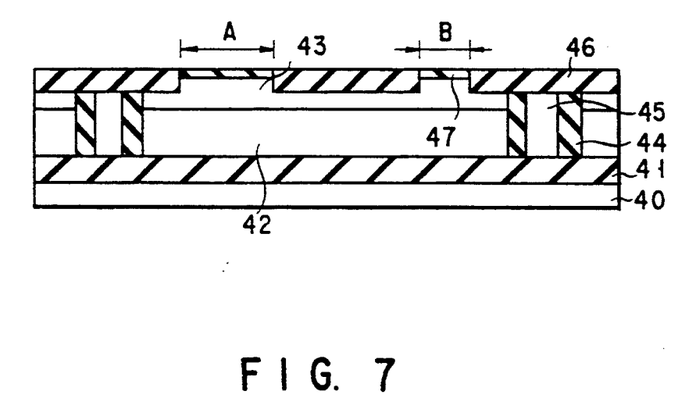

In forming the structure shown in FIG. 7, an element separating region is formed first by a trench isolation and recess method. An oxide film 44 formed in the side wall portion of a trench has a thickness of 300 nm. A buried polycrystalline silicon film 45 is not doped with an impurity and, thus, exhibits a high resistivity. An oxide film 46 in a recess separation region has a thickness of 300 nm. The thickness of each of these films 44, 45 and 46 can be determined appropriately in view of the voltage applied to the transistor, the stray capacitance of the transistor, etc. Further, a relatively thin thermal oxide film (first insulating film) 47 is formed on the surfaces of an element-forming region A and a collector take-out region B. In the embodiment shown in the drawing, the thermal oxide film 47 has a thickness of 50 nm.

Figure 8:
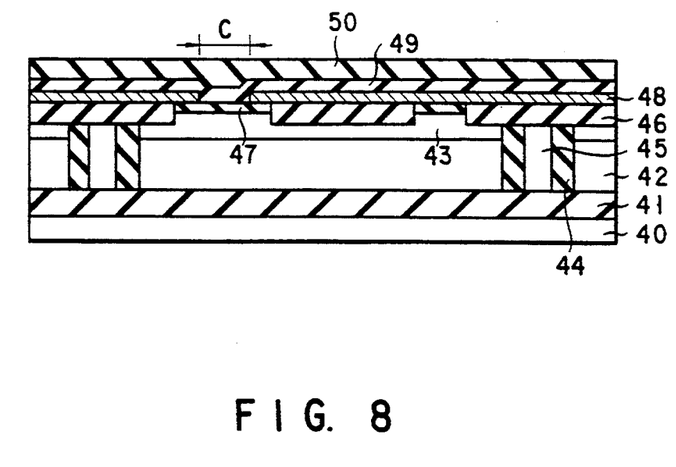

In the next step, a P-type polycrystalline silicon layer 48 acting as an electrode layer leading to a base region, which is also called an outer base region, is formed on the entire surface. The polycrystalline silicon layer 48 has a thickness of 200 nm. The polycrystalline silicon layer 48 may be doped with a P-type impurity in the step of forming the layer 48 or after formation of the layer 48. The polycrystalline silicon layer 48 thus formed is selectively removed in an element-forming region C. Incidentally, the region C is defined by the edges of the remaining portions of the polycrystalline silicon layer after the selective removing step. After the selective removing step of the layer 48, a silicon nitride film (second insulating film) or an oxynitride film 49 and a silicon oxide film (third insulating film) 50 are successively formed on the entire surface by a CVD method. The silicon nitride film 49 has a thickness of 200 nm, and the oxide film 50 is 400 nm thick.

Figure 9:
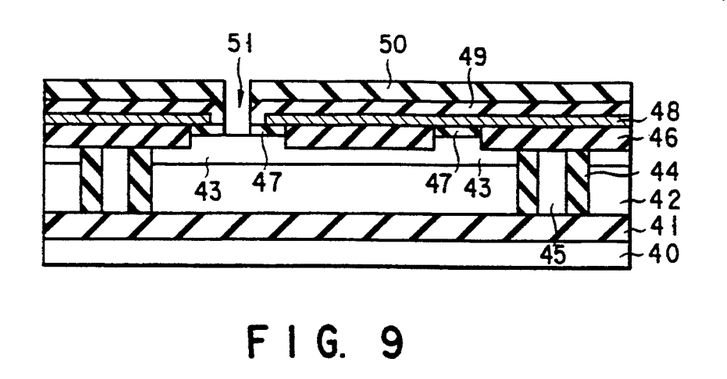

In the next step, an opening 51 extending to reach the surface layer 43 of the substrate 70 is formed in the element-forming region by selectively removing successively the silicon oxide film (third insulating film) 50, the silicon nitride film (second insulating film) 49, and the thermal oxide film (first insulating film) 47, as shown in FIG. 9. In forming the opening 51, these insulating films are removed continuously by a reactive ion etching method using a resist block by an ordinary lithography technique. It is important to note that the opening 51 should be positioned accurately within the element-forming region C shown in FIG. 8. In other words, the side wall of the P-type polycrystalline silicon layer 48 should not be exposed to the opening 51. If the region C is made unduly large in an attempt to ensure safety, however, it is impossible to secure a connecting region to an outer base region. Even if connection to the outer base can be achieved, a difficulty is brought about that the base resistance is increased. Naturally, it is important to diminish the region C as much as the manufacturing technique permits. In the embodiment shown in the drawing, an allowance of 0.3 micron is provided in the design step between the element-forming region C and the opening 51. It is possible to avoid deterioration of the element characteristics accompanying an increase in the base resistance by providing an allowance noted above of at most 0.5 micron.

Figure 10A:
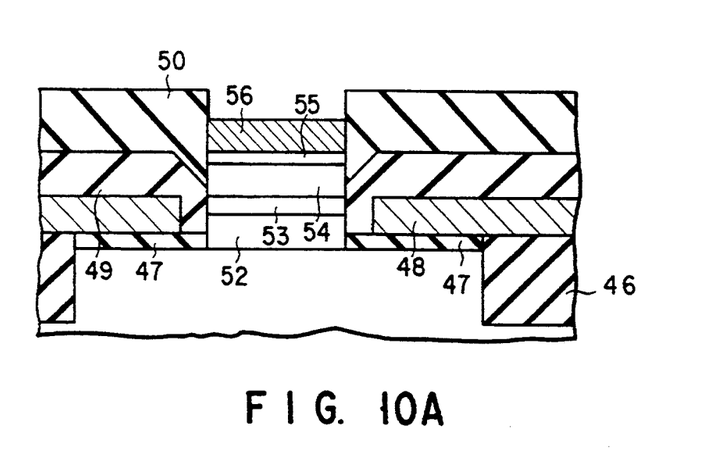
FIG. 10A shows in a magnified fashion a gist portion of the structure shown in FIG. 10B.
Figure 10B:
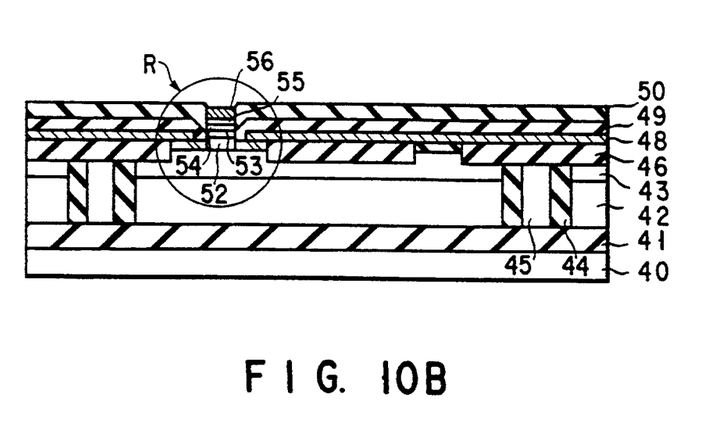

FIG. 10A shows in a magnified fashion a region put within a circle R in FIG. 10B. As shown in FIG. 10A, formed within the opening 51 are an N-type collector silicon layer (first single crystal semiconductor layer) 52, a P-type base Si-Ge layer (second single crystal semiconductor layer) 53, an N-type emitter collector layer (third single crystal semiconductor layer) 54, an N+-type emitter silicon layer 55, and a metal silicide layer 56. These semiconductor layers 52, 53, 54 and 55 are successively formed by an epitaxial growth utilizing a CVD method under a reduced pressure. In other words, these semiconductor layers should be formed under a hermetically sealed condition such that these semiconductor layers should not be exposed to the air atmosphere. The thickness of each of the first to third single crystal semiconductor layers 52, 53 and 54 should be determined to permit these semiconductor layers to be in contact with the silicon nitride film 49 exposed to the opening 51. Incidentally, it is possible for the N+-type silicon layer 55 to be formed of polycrystalline silicon.

The layer 48 need not be restricted to a silicon nitride film as far as a polycrystalline silicon layer is not formed on the side wall in the steps of forming the N-type collector silicon layer (first single crystal semiconductor layer) 52, the P-type base Si-Ge layer (second single crystal semiconductor layer) 53, the N-type emitter silicon layer (third single crystal semiconductor layer) 54, and the N+-type emitter silicon layer 55. Also, the material of the layer 48 should be determined such that the layers surrounding the layer 48 should not be etched in the step of removing the layer 48, which will be described later with reference to FIGS. 14A and 14B.

Figure 11:
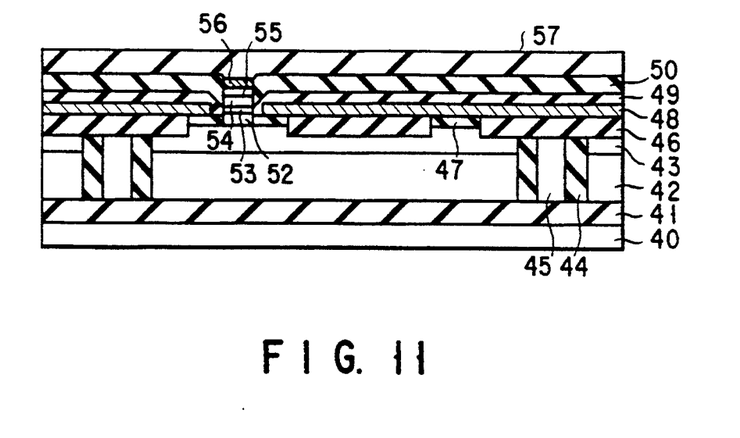

After formation of the semiconductor layers 52 to 55 and the metal silicide layer 56 within the opening 51, a silicon oxide film 57 is formed on the entire surface of the substrate by a CVD method, as shown in FIG. 11. The silicon oxide film 57 should be 400 nm thick.

Figure 12A:
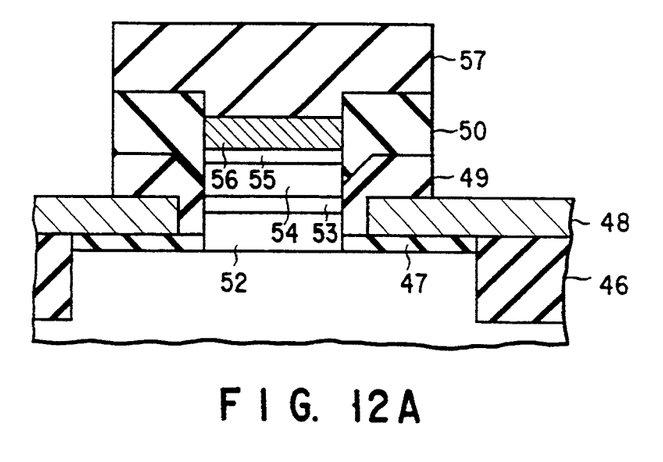
FIG. 12A shows in a magnified fashion a gist portion of the structure shown in FIG. 12B.
Figure 12B:
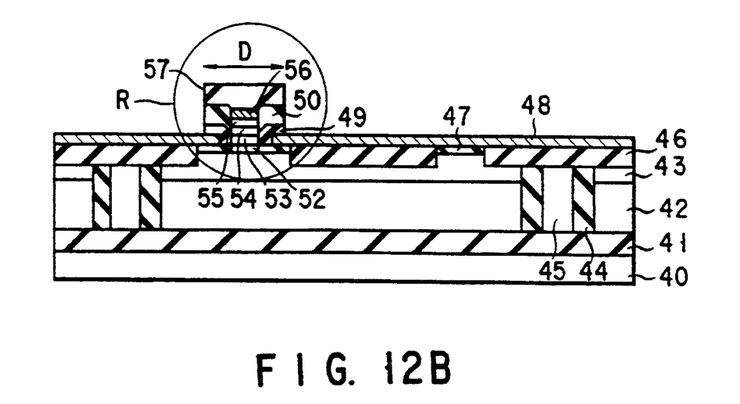

FIG. 12A shows in a magnified fashion a portion put within a circle R shown in FIG. 12B. Naturally, the structure shown in FIG. 12 is prepared by selectively removing the silicon oxide films 57, 50 and the silicon nitride film 49 shown in FIG. 11 such that these insulating films are left unremoved in the vicinity of the opening 51 to form an element gist region D. These insulating films should be removed by a reactive ion etching. The element gist region D is formed in order to define the edge portion of an outer base lead-out region which is formed in the vicinity of the element gist region. It is necessary to diminish the region D as much as possible as in the formation of the opening 51 in the step shown in FIG. 9. In the embodiment shown in the drawing, an allowance of 0.3 micron is provided in the design step in the outer circumferential region of the opening portion C of the polycrystalline silicon layer 48 shown in FIG. 5.

Figure 13:
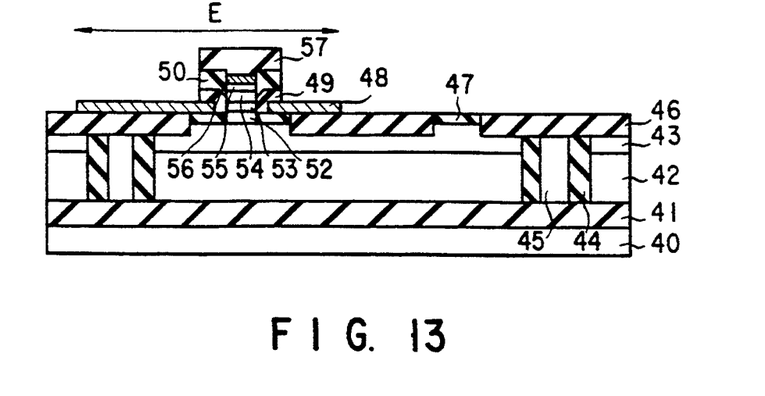

In the next step, the P-type polycrystalline silicon layer 48 is selectively removed except for the regions used as outer base lead-out regions, as shown in FIG. 13.

Figure 14A:
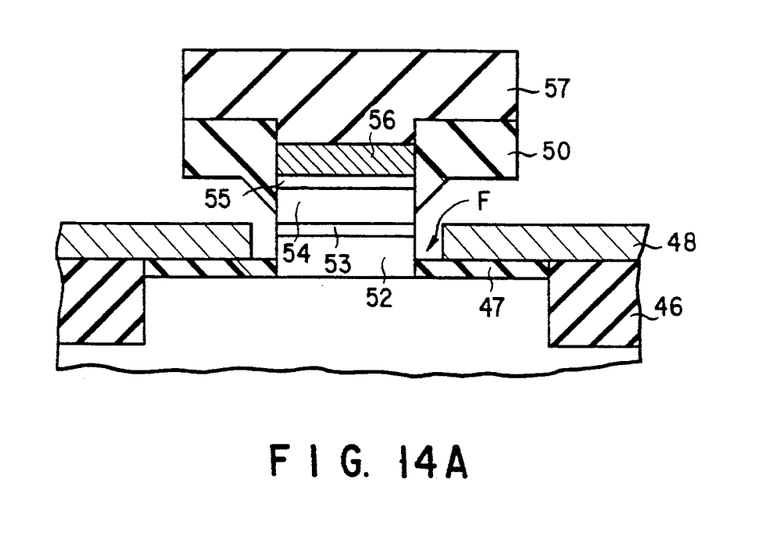
FIG. 14A shows in a magnified fashion a gist portion of the structure shown in FIG. 14B.
Figure 14B:
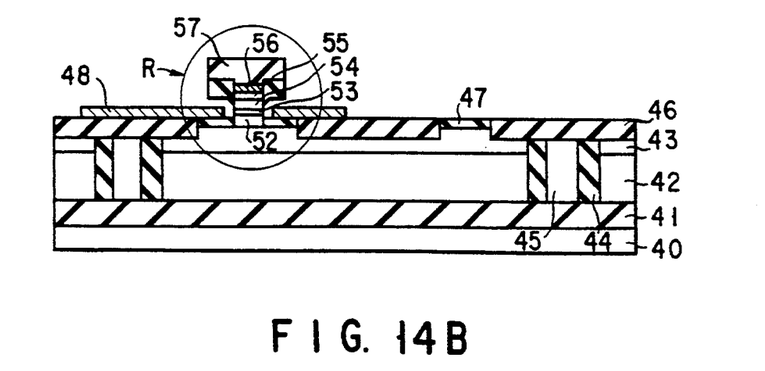

FIG. 14A shows in a magnified fashion a portion put in a circle R in FIG. 14B. As seen from the drawings, the silicon nitride film (second insulating film) 49 is selectively removed by etching with a hot phosphoric acid of 130° to 160° C. to form the structure shown in FIG. 14. As a result, formed is an opening F to which are exposed the side walls of the epitaxial layers 52, 53, 54 (first, second and third single crystal semiconductor layers). In other words, it is necessary to determine in advance the thickness of each of the N-type collector silicon layer 52, the P-type base Si-Ge layer 53 and the N-type emitter silicon layer 54 appropriately such that the side walls of these layers 52 to 54 are exposed to the opening F.

Figure 15:
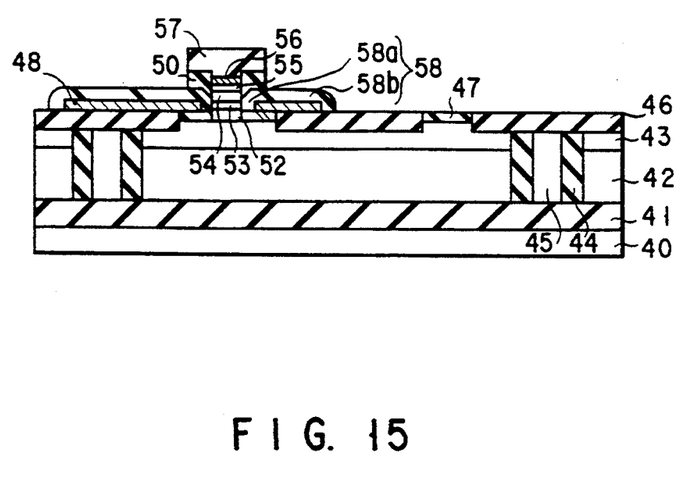
Figure 16:
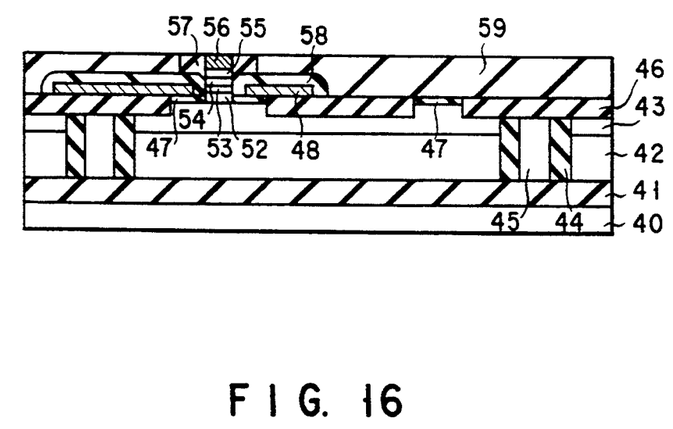

After formation of the opening F, a P-type Si-Ge layer 58 is selectively grown to fill the opening F resulting from removal of the second insulating film 49 and to cover the P-type polycrystalline silicon layer 48, as shown in FIG. 15. In this step, a single crystal Si-Ge layer (fourth single crystal semiconductor layer) 58a is grown to form a region which is in contact with the side walls of the first to third single crystal semiconductor layers. Also, a polycrystalline Si-Ge layer 58b is grown to cover the P-type polycrystalline silicon layer 48. It follows that the base region 53 of the element portion is connected to the outer base lead-out region. Incidentally, the outer base lead-out region is formed of a laminate structure consisting of the P-type polycrystalline silicon layer 48 and the Si-Ge layer 58. It follows that the base lead-out resistance can be diminished by adjusting the resistance value of the P-type polycrystalline silicon layer 48. Incidentally, the material of the layer 58 need not be restricted to Si-Ge. It is also possible for the layer 58 to be formed of a material which is substantially equal in the energy band gap to the P-type base Si-Ge layer 53 in the case where the layer 53 is used as a base of the hetero bipolar transistor.

In the next step, a silicon oxide film 59 is formed on the entire surface of the substrate by a CVD method, followed by smoothing the entire region of the silicon oxide film 59 by an ordinary smoothing technique and subsequently reducing the thickness of the oxide film so as to expose the emitter upper portion. Further, contact holes for the collector H and the base G are formed in the silicon oxide film 59 by a known method, as shown in FIG. 4, followed by forming a collector electrode 62, a base electrode 61 and an emitter electrode 60.

In the embodiment described above, the opening 51 extending to reach the substrate is formed in the laminate structure formed on the main surface of the substrate, said laminate structure consisting of the first insulating film ($SiO_2$) 47, the second insulating film (SiN) 49 and the third insulating film ($SiO_2$) 50, followed by successively filling the opening 51 with the first single crystal silicon semiconductor layer 52, the second single crystal Si-Ge semiconductor layer 53, and the third single crystal silicon semiconductor layer 54 in this order by a continuous selective epitaxial growth technique so as to form the emitter-base junction and the base-collector junction performing the transistor function by self-alignment. It should be noted that these single crystal semiconductor layers are formed under a hermetically sealed condition. What should also be noted is that the interfaces between the emitter region and the base region and between the base region and the collector regions are not exposed to the air atmosphere. Also, these interfaces are not subjected to ion bombardment. It follows that the problems inherent in the prior art, which are caused by the contamination, crystal disturbance, etc. in the interfaces, do not take place in the hetero bipolar transistor of the present invention.

It should also be noted that, after formation of the emitter layer, the base layer and the collector layer performing the transistor function, the second insulating film (SIN) is selectively removed by etching with a hot phosphoric acid in the present invention so as to form an opening such that the side walls of the base layer, the emitter layer and the collector layer are partly exposed to the opening. Then, the Si-Ge single crystal layer is allowed to grow in the lateral direction within the opening such that the grown layer is in contact with the exposed side walls of these base, emitter and collector layers. As a result, the opening is filled with the Si-Ge single crystal layer. Growth of a single crystalline or polycrystalline Si-Ge layer is further continued so as to form easily a base lead-out layer having a low resistance. Further, the base lead-out layer is surrounded by the first and third insulating films, etc. and does not form a junction with the collector or emitter region. It follows that the stray capacitance can be sufficiently diminished.

As described above in detail, the present invention makes it possible to provide an improved hetero bipolar transistor and a method of manufacturing the same. To be more specific, the present invention permits suppressing undesired mechanical damages done to the base layer such as reduction in the thickness and disturbance of crystals, and also permits preventing the outer surface of a base Si-Ge layer from being exposed to the air atmosphere during the manufacturing process of the hetero bipolar transistor so as to improve the capability of controlling the emitter-base interface. The present invention also makes it possible to achieve a base-emitter structure by self-alignment technique without employing a manufacturing step requiring a technique of a particularly high level so as to diminish sufficiently the base resistance and the stray capacitance. It follows that the hetero bipolar transistor of the present invention can be operated with a high speed.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a hetero bipolar transistor, comprising the steps of:
   preparing a semiconductor substrate;
   forming a first polycrystalline silicon layer on an entire surface of said semiconductor substrate;
   selectively removing said first polycrystalline silicon layer to expose a surface of said semiconductor substrate;
   forming an oxynitride layer on an entire surface of the resultant structure in a manner to cover a side wall of said first polycrystalline silicon layer;
   forming a first insulating layer on the resultant structure;
   selectively removing said first insulating layer and said oxynitride layer to form an opening extending to reach said semiconductor substrate, said side wall of said first polycrystalline silicon layer not being exposed by said opening;
   forming a laminate structure consisting of a first semiconductor layer, a second semiconductor layer and a third semiconductor layer by means of an epitaxial vapor growth technique, said opening being filled with said laminate structure, and at least a side wall of said second semiconductor layer being in contact with the side wall of said oxynitride layer;
   selectively removing said insulating layer and said oxynitride layer to allow the remaining portions of these insulating layer and oxynitride layer to surround said laminate structure consisting of the first, second and third semiconductor layers;
   removing the remaining portion of said oxynitride layer to form a cavity; and
   forming a fourth semiconductor layer by means of an epitaxial vapor growth technique to cover the first polycrystalline silicon layer and the side walls of the laminate structure consisting of the first, second and third semiconductor layers said cavity being filled with said fourth semiconductor layer.

2. The method of manufacturing a hetero bipolar transistor according to claim 1, which further comprises the steps of:
   forming a fifth semiconductor layer on said third semiconductor layer;
   forming a metal silicide layer on said fifth semiconductor layer; and
   forming a second insulating layer on an entire surface of the resultant structure.

3. The method of manufacturing a hetero bipolar transistor according to claim 1, wherein said semiconductor substrate has an SOI structure.

4. The method of manufacturing a hetero bipolar transistor according to claim 1, wherein said step of removing the remaining portion of said oxynitride layer is carried out by using a hot phosphoric acid.

5. The method of manufacturing a hereto bipolar transistor according to claim 1, wherein said step of forming a laminate structure consisting of a first semiconductor layer, a second semiconductor layer and a third semiconductor layer by means of an epitaxial vapor growth technique is carried out by using a low pressure CVD method.

6. The method of manufacturing a hetero bipolar transistor according to claim 1, wherein said step of forming a laminate structure consisting of a first semiconductor layer, a second semiconductor layer and a third semiconductor layer is carried out under the condition that these semiconductor layers are not exposed to the air atmosphere.

* * * * *